United States Patent
Hoang

(10) Patent No.: US 6,697,281 B2
(45) Date of Patent: Feb. 24, 2004

(54) BYTE-SELECTABLE EEPROM ARRAY UTILIZING SINGLE SPLIT-GATE TRANSISTOR FOR NON-VOLATILE STORAGE CELL

(75) Inventor: Loc B. Hoang, San Jose, CA (US)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 10/010,617

(22) Filed: Nov. 8, 2001

(65) Prior Publication Data

US 2003/0095436 A1 May 22, 2003

(51) Int. Cl.⁷ .............................................. G11C 16/04
(52) U.S. Cl. ............................. 365/185.17; 365/185.11; 365/185.29
(58) Field of Search ...................... 365/185.17, 185.11, 365/185.29, 185.01

(56) References Cited

U.S. PATENT DOCUMENTS

| | | | | |
|---|---|---|---|---|
| 5,615,149 A | * | 3/1997 | Kobayashi et al. | 365/185.12 |
| 5,812,452 A | | 9/1998 | Hoang | |
| 6,088,267 A | * | 7/2000 | Atsumi et al. | 365/185.23 |
| 6,314,022 B1 | * | 11/2001 | Kawata et al. | 365/185.05 |

\* cited by examiner

*Primary Examiner*—Hoai Ho
(74) *Attorney, Agent, or Firm*—Townsend and Townsend and Crew LLP

(57) ABSTRACT

A flash electrically-erasable, programmable read-only memory (EEPROM) with reduced area. The memory cells of the EEPROM are arranged into groups, and access to the groups is controlled by select transistors. In this manner the number of select transistors is reduced without requiring the entire array to be programmed or erased.

12 Claims, 6 Drawing Sheets

BYTE-SELECTABLE EEPROM ARRAY UTILIZING SINGLE SPLIT-GATE TRANSISTOR FOR NON-VOLATILE STORAGE CELL

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention relates to flash electrically-erasable, programmable read-only memories (EEPROMs). In particular, the present invention relates to flash EEPROMs having selectable groups.

FIG. 1A is a cross-sectional view of a standard floating gate tunnel oxide (FLOTOX) cell 20. In the FLOTOX cell 20, there is a polysilicon control gate 22 where a control voltage $V_{CG}$ may be applied, a polysilicon floating gate 24, a source terminal having a source voltage potential $V_S$ coupled to an n-type region 32, a drain terminal having a drain voltage potential $V_D$, and another polysilicon 26 over two n-type regions, 28 and 30, forming a select transistor on a p-type substrate 34. An inter-poly dielectric region 38 is defined between the two polysilicon pieces 22 and 24 (control gate and floating gate); two gate-dielectric regions 40 and 44 are defined by the respective polysilicon areas; and a tunnel dielectric region is defined by the tunnel window region 36 of the polysilicon piece 24 (floating gate). Due to the specific shape of the control gate 22 and the floating gate 24, a tunnel window region 36 is defined to allow the tunneling of electrons.

FIG. 1B is a schematic representation of the FLOTOX cell 20, in which a FLOTOX transistor 46 is coupled in series with a select transistor 48. In operation, the select transistor 48 is turned on in order to operate the FLOTOX transistor 46. A drain/source terminal 50 serves as the source terminal for the select transistor 48 and the drain terminal for the FLOTOX transistor 46.

Programming of the FLOTOX memory cell is carried out by applying a relatively high voltage pulse between the control gate 22 and the drain terminal 30 when there is a positive voltage applied at the select gate terminal 26. The high voltage pulse initiates carrier generation in the substrate and causes electrons to penetrate the tunnel-dielectric region 42 and accumulate in the floating gate 24. In a likewise manner, in erasing the memory cell, an inverse voltage is applied between the gate and drain terminals. Thus, the negative electrons in the floating gate are drawn to the drain through the thin tunnel oxide.

The erase and program operations are achieved by taking advantage of the Fowler-Nordheim (F-N) tunneling mechanism occurring between the floating gate 24 and the silicon substrate 34 through a thin oxide called the tunnel oxide 42.

A tunnel window 36 defines the area of the tunnel oxide where a large tunnel window would improve the speed of the erase/program operation but would also increase the cell size. A thinner tunnel oxide region 42 would reduce the tunneling voltage requirement and reduce the erase/program operation time. However, such a memory cell is more difficult to manufacture and may have increased reliability concerns.

Thus, attributes of the FLOTOX cell 20 include a relatively long tunneling time, a relatively large tunneling voltage, and a relatively long erase time.

FIG. 2A is a cross-sectional view of another important type of non-volatile memory, the flash memory. In the flash memory cell 60, there is a drain (62 or 64) and a source (64 or 62) region deposited on and within a substrate 76. Over the substrate and the drain and source regions, insulating layers 66 and 68 are deposited. Over the insulating layers, a floating gate 70 is disposed in such a manner to partially overlap one of the drain and source regions. A second insulating layer 72 is then deposited over the floating gate 70. A control gate 74 is then disposed over the floating gate 70 and partially overlapping the other region.

FIG. 2B is the schematic representation of the memory cell 60 showing its circuit symbol.

In operation, the flash memory cell 60 is erased when the drain and source terminals are connected to ground and a high voltage is applied at the control gate 74, causing electrons in the floating gate 70 to tunnel to the control gate 74. Comparing the tunneling process occurring in the FLOTOX memory cell 20 of FIG. 1A, the tunneling of electrons in the flash memory cell 60 of FIG. 2A is a faster process requiring lower voltage potential across the respective terminals. Additionally, the typical erase time for the flash memory cell is less than 1 ms with approximately 14 volts applied. The erase time and/or (lower) voltage potential can be further improved by modifying and optimizing the dimensions of the memory cell.

To program the memory cell, the control gate 74 is set to be barely-on (around 2 volts), the terminal connected to the region 62, away from the floating gate 74, is connected to ground, and the terminal connected to the region 64 closer to the floating gate 74 is provided with a high voltage, generally around 12 volts. In this manner, an electric field is generated in the direction of the region 62 away from the floating gate 70, causing electrons to travel through the channel region and be injected into the floating gate 70, thereby charging the gate and programming the memory cell 60. The flow of the electrons in this process is called hot carrier injection and is illustrated by the arrows.

FIG. 3A shows a memory array 80 having a plurality of interconnected flash memory cells 60 arranged in rows and columns. The flash memory cells 60 are connected in such a manner that the terminals closer to the floating gates 70 are designated as the source terminals. The control gates 74 of the memory cells along the same row are connected to the same word line (e.g., WL0, WL1, etc.). The word lines are controlled and operated by a row address decoder 82 in response to a given row address. The source terminals of the memory cells along the same row are connected to the same source line (e.g. SL0, SL1, etc.). The source lines are also controlled and operated by the row address decoder 82. In a similar manner, the drain terminals of the memory cells along the same columns are connected to the same bit line (e.g., BL0, BL1, etc.). The bit lines are controlled and operated by a column decoder 84 in response to a given column address (Y-MUX is a column address line multiplexer). In a read operation, the signals are amplified by a sense amplifier 86 and put into an output buffer 88. In a program operation, data is first stored in an input buffer 90 before it is passed through the column decoder 84 for storage. In order to properly program data into the memory cells, data stored in the memory cells on the same row will have to be erased before the program operation. The reason here is that the control gate of the memory cells on the same row are connected to the same word line and hence will be affected as a group. In comparison, in such a memory array using flash memory cells, the memory cells have to be altered on a large block basis (here the entire row) while a memory array using FLOTOX memory cells can be altered on a byte to byte basis. When a memory array is altered on a block basis, invariably some of the data that does not need to be altered has to be rewritten back into the memory array which consumes time and power in the process.

FIG. 3B is similar to FIG. 3A except that the flash memory cells 60 are connected in such a manner that the terminals farthest from the floating gates 70 are designated as the source terminals. The consequences of this difference are detailed below.

The row address decoder 82 and column address decoder 84 control the bit lines, word lines and source lines during erase, program and read operations as detailed in Tables 1A and 1B. Table 1A gives the operating characteristics for the memory cell of FIG. 2 using the flash memory array of FIG. 3A. Table 1B gives the operating characteristics for the memory cell of FIG. 2 using the flash memory array of FIG. 3B.

transistors. Vcgp is thus approximately +2 volts. Vdp0 is the drain programming voltage to be applied to the selected storage transistors in order to program them with a logical input data of "0" (i.e., to store electrons into the floating gate (FG)). It can be approximately either 12 volts (Vp) or +0 volts (Vs) depending upon the array and memory cell configurations. Vdp1 is the drain programming voltage to be applied to the selected storage transistors in order to program them with a logical input data of "1" (i.e., not to store electrons into the FG), which is the same as program-inhibit, which is also the same as for unselected bit lines or storage transistors. It can be approximately either 0 volts (Vs) or 5 volts (Vcc) depending upon the array and memory cell configurations. Vcgr is the CG read bias voltage, which may be approximately +4 volts depending upon the fabrication process and design. Vdr is the drain read bias voltage, which may be approximately between +1.5 to +2 volts. Vcc is the power supply voltage, which may be approximately +5 volts depending upon the fabrication process and design.

One of the problems of the memory array structure shown in FIGS. 3A and 3B is that the memory cells have to altered on a large block (i.e., row) basis even when part of the data does not need to be altered. Consequently, even unaltered data is required to be rewritten back to the memory cells, consuming power and time in the process.

U.S. Pat. No. 5,812,452 (which is incorporated herein by reference in its entirety for all purposes) provides one potential solution to the above problem. Each memory cell in this patent includes two transistors: a select transistor and a storage transistor. The select transistor is connected in series with the storage transistor. When placed in a memory

TABLE 1A

| | Bit Line (BL) (Drain) | | Word Line (WL) (Gate) | | Source Line (SL) (Source) | |
|---|---|---|---|---|---|---|
| | Select | Non-Select | Select | Non-Select | Select | Non-Select |
| Erase | Vs (~0 V) | Vs (~0 V) | Ve (~15 V) | Vs (~0 V) | Vs (~0 V) | Vs (~0 V) |
| Program | Vdp0/Vdp1 (~Vs/Vcc) | Vcc (~5 V) | Vcgp (~2 V) | Vs (~0 V) | Vp (~12 V) | Vs (~0 V) |
| Read | Vdr (~2 V) | Vs (~0 V) | Vcgr (~4 V) | Vs (~0 V) | Vs (~0 V) | Vs (~0 V) |

TABLE 1B

| | Bit Line (BL) (Drain) | | Word Line (WL) (Gate) | | Source Line (SL) (Source) | |
|---|---|---|---|---|---|---|
| | Select | Non-Select | Select | Non-Select | Select | Non-Select |
| Erase | Vs (~0 V) | Vs (~0 V) | Ve (~15 V) | Vs (~0 V) | Vs (~0 V) | Vs (~0 V) |
| Program | Vdp0/Vdp1 (Vp/Vs) | Vs (~0 V) | Vcgp (~2 V) | Vs (~0 V) | Vs (~0 V) | Vs (~0 V) |
| Read | Vdr (~2 V) | Vs (~0 V) | Vcgr (~4 V) | Vs (~0 V) | Vs (~0 V) | Vs (~0 V) |

In Tables 1A and 1B, the abbreviations have the following meanings. Vs is the source voltage during read or erase. It has a low potential voltage of approximately 0 V. Ve is the control gate (CG) erasure voltage required for F-N tunneling. It is approximately +15 volts depending upon the fabrication process used. Vp is the programming voltage applied to the drain (or source near the floating gate side) of the storage transistors. It is approximately +12 volts depending upon the fabrication process used. Vcgp is the CG programming voltage. It should be higher than the threshold voltage of the storage transistors to be erased (generally approximately 1.5 volts) in order to turn on the selected array, a predefined number of memory cells can be grouped into blocks. By using a block select transistor, the memory cells can be accessed and altered on a block-by-block basis.

However, the solution described in U.S. Pat. No. 5,812,452 requires two transistors per bit stored. This increases the size of the memory array.

There is a need to reprogram less than large blocks of an EEPROM array without requiring so much additional area occupied by requiring two transistors per bit stored.

BRIEF SUMMARY OF THE INVENTION

According to one embodiment of the present invention, a flash EEPROM includes a plurality of groups of memory cells, one or more group select lines, a plurality of first select transistors, a plurality of second select transistors, a plurality of first word lines, and a plurality of second word lines. The group select lines provide an erasure voltage. The first and second word lines control the first and second select transistors to couple the erasure voltage to a selected group of memory cells.

In this manner, a group of memory cells may be erased while requiring only two select transistors per group. If each group is an eight-bit byte, the number of required select transistors is only one-fourth that required in the prior art such as U.S. Pat. No. 5,812,452.

These and other features of the present invention will become well understood from an examination of the following drawings and detailed description.

DETAILED DESCRIPTION OF THE INVENTION

Figure 3A:
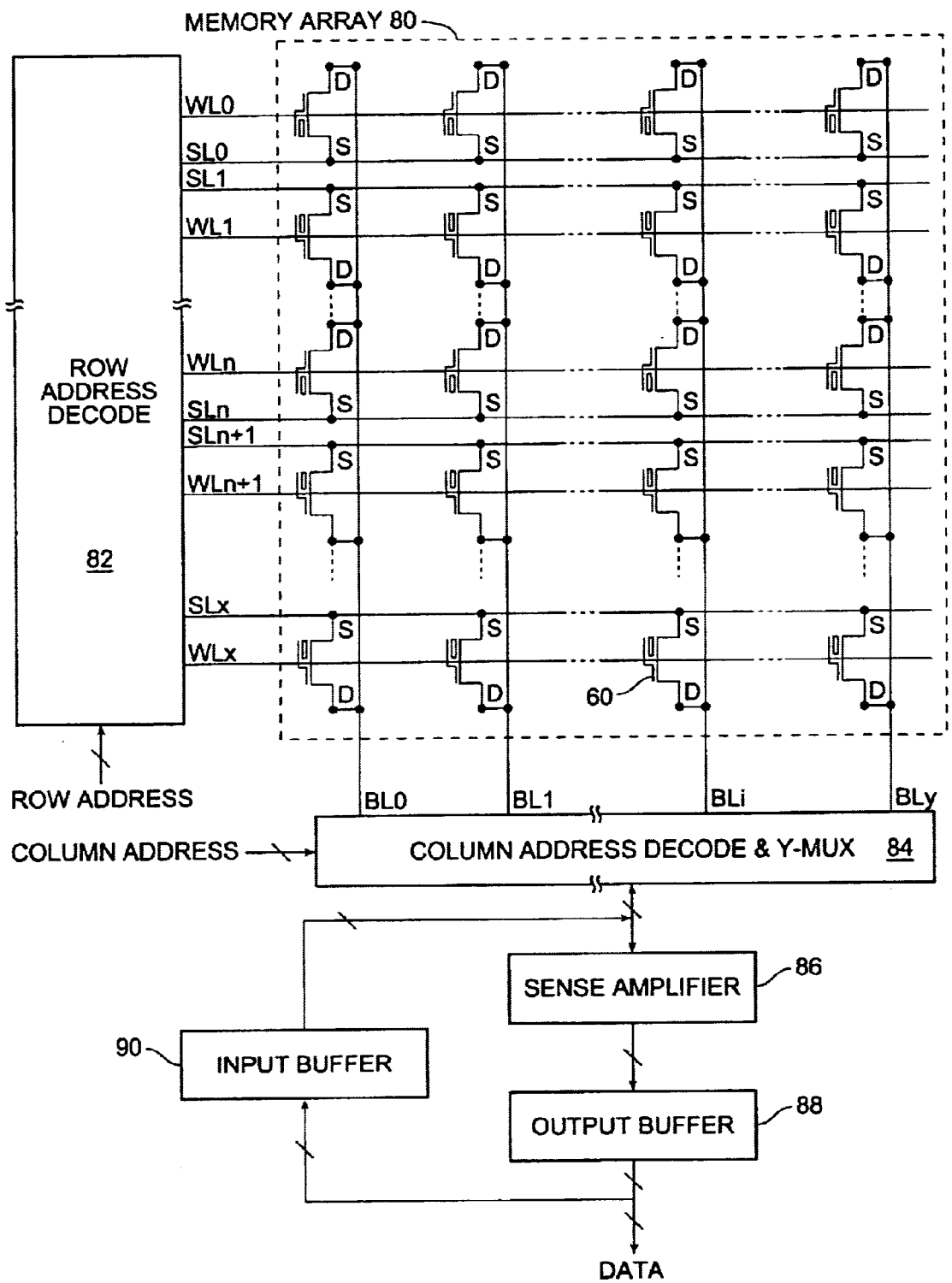
FIG. 3A is a schematic diagram of a first conventional memory array.
Figure 3B:
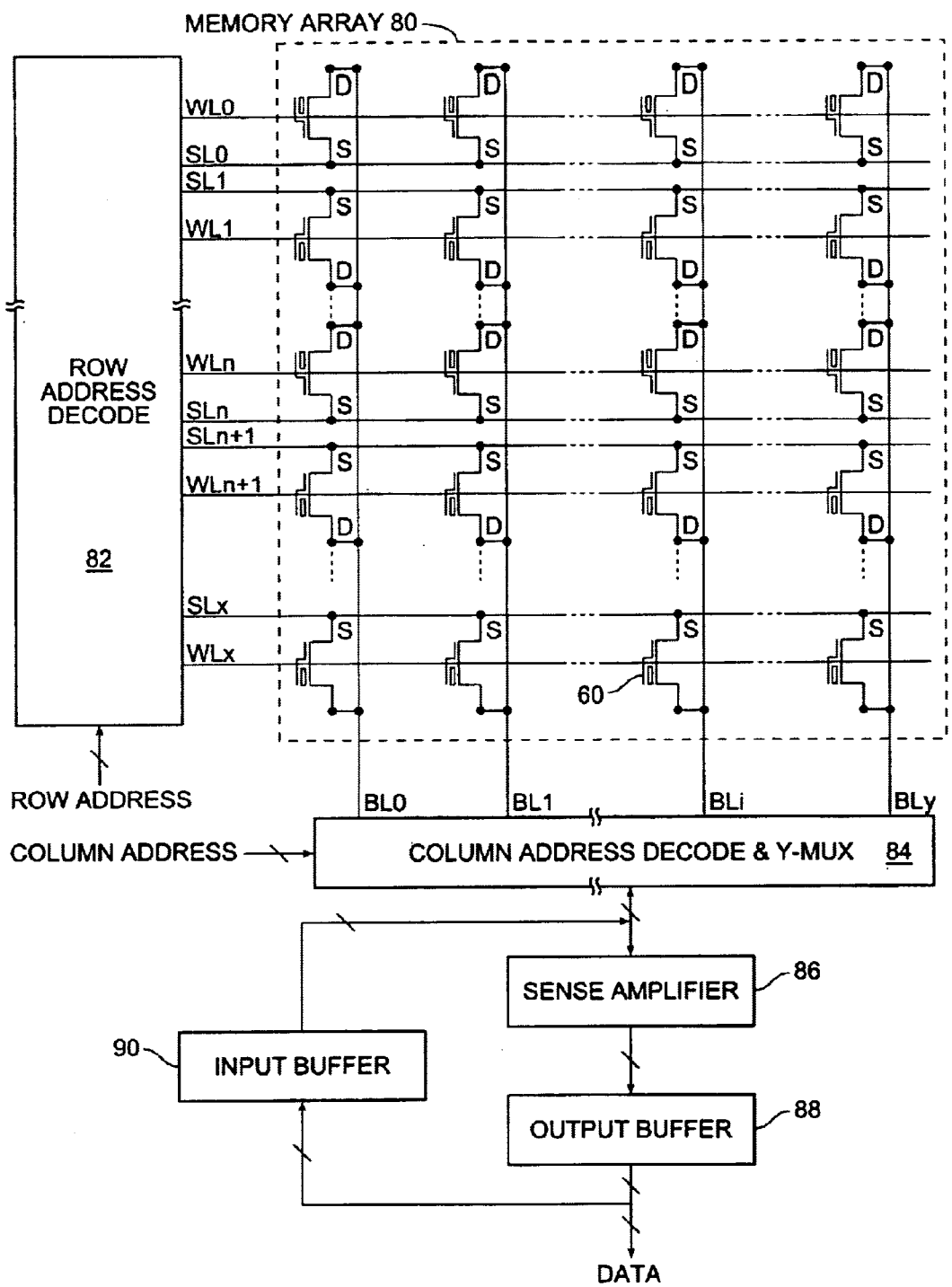
FIG. 3B is a schematic diagram of a second conventional memory array.
Figure 4A:
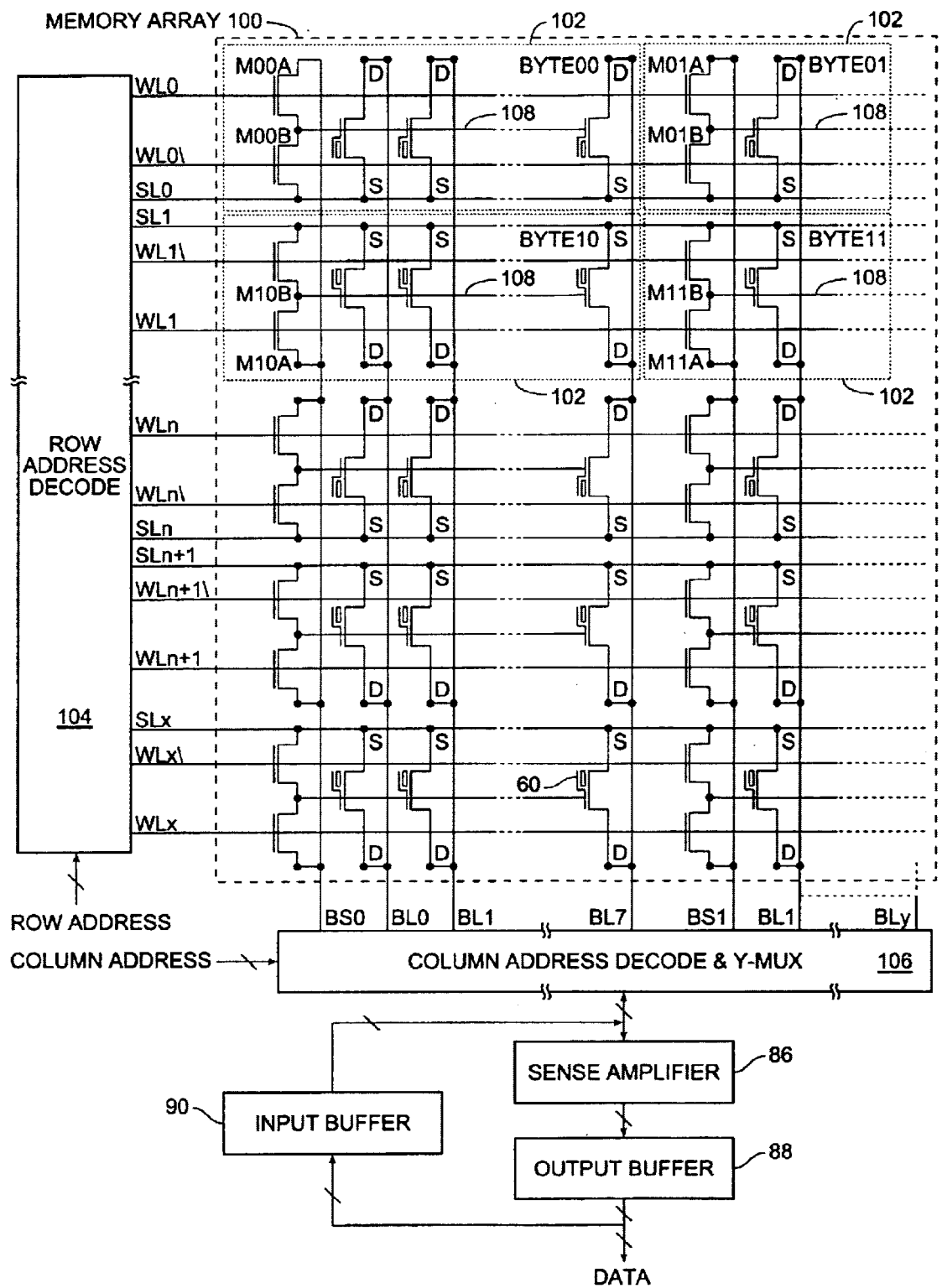
FIG. 4A is a schematic diagram of a memory array according to an embodiment of the present invention.

FIG. 4A shows one embodiment of a memory array 100 according to the present invention. The memory array 100 includes a number of groups 102 of memory cells 60. Each group 102 is shown in FIG. 3A as being an eight-bit byte and thus includes eight storage transistors. Other group sizes are possible according to design criteria. The groups 102 are organized into rows and columns. The memory array 100 can include any number of rows and columns according to design criteria.

The memory array 100 has numerous similarities to the memory array 80 of FIG. 3A. The word lines WL0, WL1, etc. control horizontal access to the groups 102. The bit lines BL0, BL1, etc. provide access to each bit in the groups 102. The source lines SL0, SL1, etc. provide a source connection. The functions of the sense amplifier 86, the output buffer 88, and the input buffer 90 are the same as described above.

However, there are numerous differences from the memory array 80 of FIG. 3A. One difference is the addition of block select transistors (e.g., M00A, M01A, etc.; collectively MA) and block deselect transistors (e.g., M00B, M01B, etc.; collectively MB). A second difference is the addition of word deselect lines (e.g., WL0\, WL1\, etc.). A third difference is the addition of block select lines (e.g., BS0, BS1, etc.). These differences also involve changes to the row address decoder 104 and the column address decoder 106.

The block select transistors MA are coupled between the block select lines BS and the control gate sublines 108 for each group 102. Each control gate subline 108 is coupled to the control gates of the flash memory cells in a corresponding group 102.

The block deselect transistors MB are coupled between the block select transistors MA and the source lines SL. Thus, the block deselect transistors can couple the control gate sublines 108 to the source lines SL.

The word lines WL control the block select transistors MA, and the word deselect lines WL\ control the block deselect transistors MB. The word lines WL provide horizontal (row) access to the memory array 100. In operation, a particular word deselect line WL\ is provided a logic level complementary to that of its associated word line WL. For example, if WL0 is at a logic level of "high" then WL0\ is at a logic level of "low." Therefore, each control gate subline 108 is coupled either to its corresponding block select line BS or to its corresponding source line SL.

The block select lines BS provide vertical (column) access to the memory array 100. Therefore, by a particular combination of one word line WL and one block select line BS, a particular block 102 may be accessed for reading, programming or erasing.

Figure 4B:
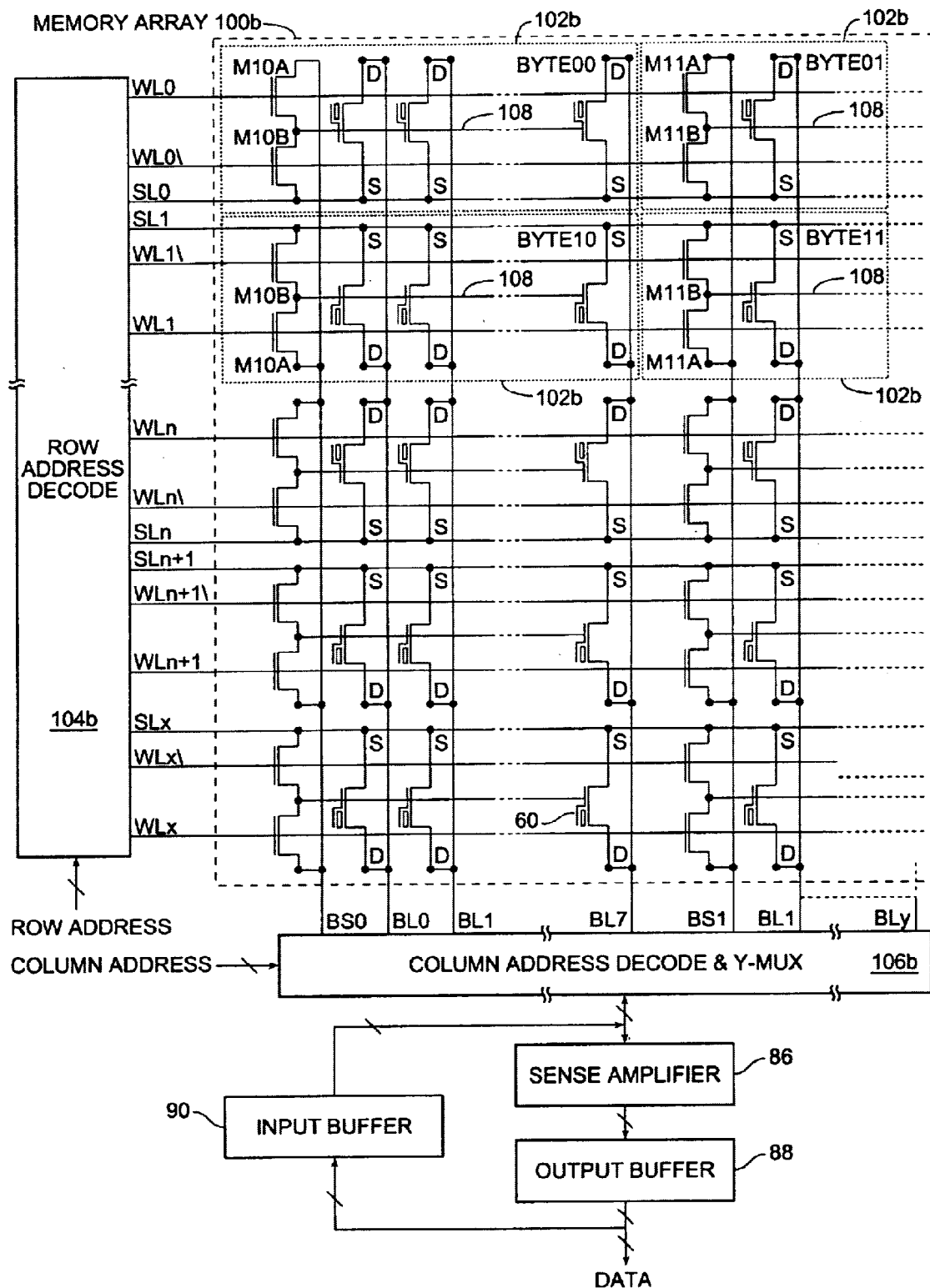
FIG. 4B is a schematic diagram of a memory array according to another embodiment of the present invention

FIG. 4B shows another embodiment of a memory array 100b according to the present invention. The memory array 100b is similar to the memory array 100 of FIG. 4A except that the drain (connected to the bit line BL) is defined to be the region near the floating gate side of the memory cell 60. The memory cells 102b are similar to the memory cells 102, as are the sense amplifier 86, output buffer 88 and input buffer 90. The major consequence of redefining the drain of the memory cells 60 is that the row address decoder 104b and column address decoder 106b provide different control voltages to the word lines WL, word deselect lines WL\, block select lines BS, and source lines SL than the row address decoder 104 and the column address decoder 106 of FIG. 4A.

Figure 1A:
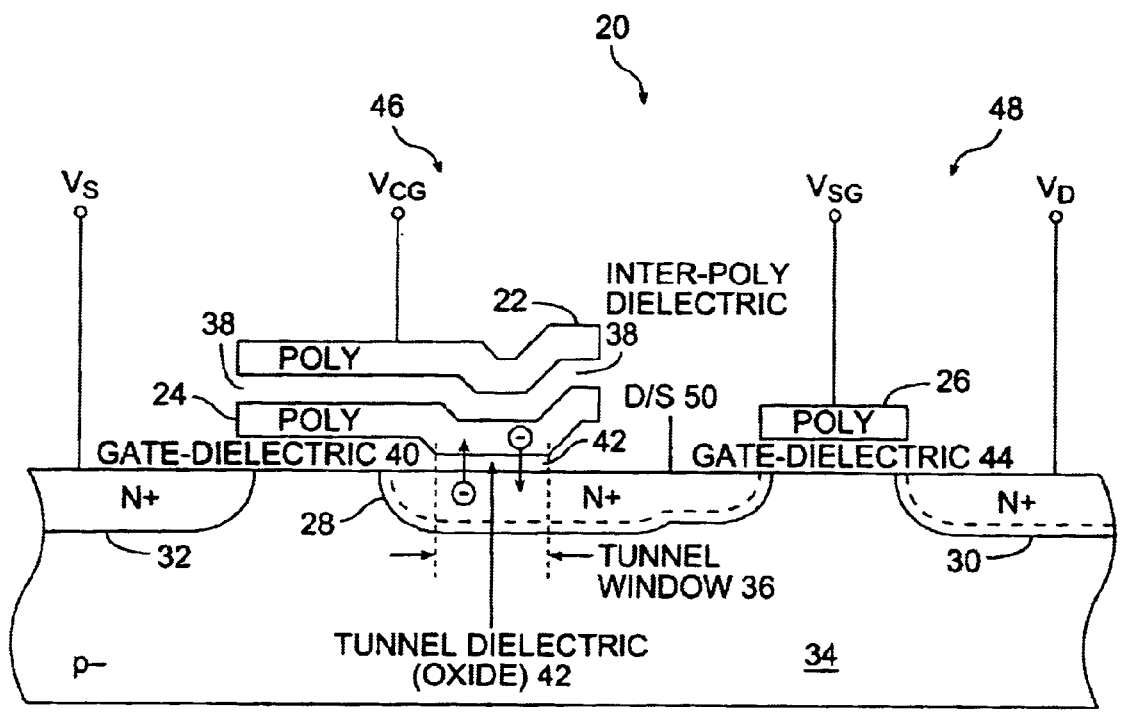
FIG. 1A is a cross-sectional side view of a conventional FLOTOX memory cell.
Figure 1B:
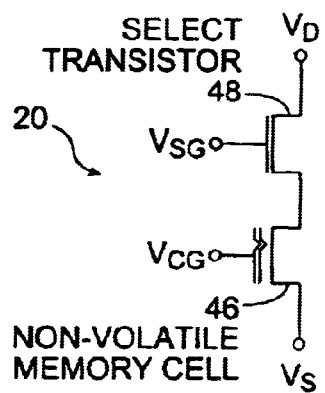
FIG. 1B is a schematic symbol for the FLOTOX cell of FIG. 1A.
Figure 2A:
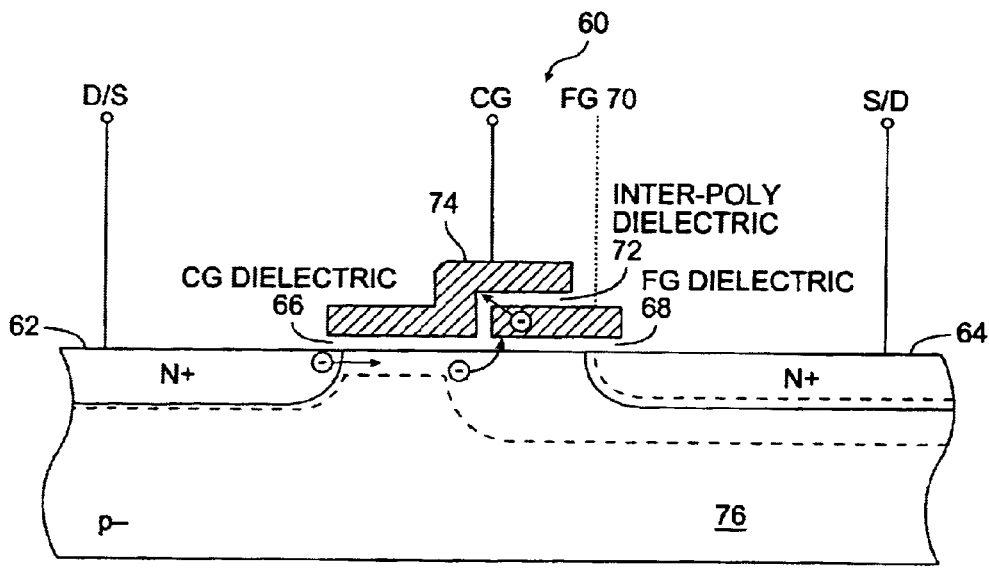
FIG. 2A is a cross-sectional side view of a conventional flash memory cell.
Figure 2B:
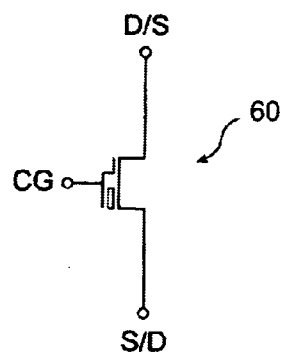
FIG. 2B is a schematic symbol for the flash cell of FIG. 2A.

The row address decoder 104 (104b) and column address decoder 106 (106b) control the bit lines BL, word lines WL, word deselect lines WL\, block select lines BS, and source lines SL as set forth in Tables 2A and 2B. Table 2A gives the operating characteristics for the memory cell of FIG. 2 using the flash memory array of FIG. 4A. Table 2B gives the operating characteristics for the memory cell of FIG. 2 using the flash memory array of FIG. 4B.

In Tables 2A and 2B, the abbreviations have the same meanings as discussed above regarding Tables 1A and 1B. In addition, Vwle is the word line erasure voltage. It should be greater than or equal to Ve plus the threshold voltage of the select transistor Vt. Assuming a Vt of approximately +2 volts, Vwle is approximately +17 volts. Vwle and Ve can both be +17 volts such that the actual voltage on the CG of the storage transistors is adequate for F-N tunneling (e.g., approximately +15 volts).

TABLE 2A

| | Bit Line (BL) (Drain) | | Word Line (WL) (Gate) | | Block Select Line (BS) | | Source Line (SL) (Source) | |
|---|---|---|---|---|---|---|---|---|
| | Select | Non-Select | Select | Non-Select | Select | Non-Select | Select | Non-Select |
| Erase | Vs (~0 V) | Vs (~0 V) | Vwle (~17 V) | Vs (~0 V) | Ve (~15 V) | Vs (~0 V) | Vs (~0 V) | Vs (~0 V) |
| Program | Vdp0/Vdp1 (Vs/Vcc) | Vcc (~5 V) | Vcc (~5 V) | Vs (~0 V) | Vcgp (~2 V) | Vs (~0 V) | Vp (~12 V) | Vs (~0 V) |
| Read | Vdr (~2 V) | Vs (~0 V) | Vcc (~5 V) | Vs (~0 V) | Vcgr (~4 V) | Vs (~0 V) | Vs (~0 V) | Vs (~0 V) |

TABLE 2B

| | Bit Line (BL) (Drain) | | Word Line (WL) (Gate) | | Block Select Line (BS) | | Source Line (SL) (Source) | |
|---|---|---|---|---|---|---|---|---|
| | Select | Non-Select | Select | Non-Select | Select | Non-Select | Select | Non-Select |
| Erase | Vs (~0 V) | Vs (~0 V) | Vwle (~17 V) | Vs (~0 V) | Ve (~15 V) | Vs (~0 V) | Vs (~0 V) | Vs (~0 V) |
| Program | Vdp0/Vdp1 (Vp/Vs) | Vs (~0 V) | Vcc (~5 V) | Vs (~0 V) | Vcgp (~2 V) | Vs (~0 V) | Vs (~0 V) | Vs (~0 V) |
| Read | Vdr (~2 V) | Vs (~0 V) | Vcc (~5 V) | Vs (~0 V) | Vcgr (~4 V) | Vs (~0 V) | Vs (~0 V) | Vs (~0 V) |

As detailed above, a group 102 (102b) of memory cells 60 may be erased while requiring only two select transistors (MA and MB) per group. If each group is an eight-bit byte, the number of required select transistors is only one-fourth that required in the prior art such as U.S. Pat. No. 5,812,452. This reduces the space occupied by the memory array 100 (100b).

According to another embodiment, the source lines SL of two adjacent rows of memory cells 102 (102b) are combined into one source line. For example, in the memory array 100 of FIG. 4A, the source lines SL0 and SL1 may be combined into a single source line. This combining further reduces the space occupied by the memory array 100 (100b). Referring to TABLE 2B, note that this combining has no negative consequences to the memory array 100b because the source line SL voltage is always Vs (0 V). Referring to TABLE 2A, note that the programming voltage Vp differs from the source voltage Vs, so this will introduce more write disturbance to the non-selected adjacent row during programming for the memory array 100. This combining involves changes to the control logic of the row address decoder 104 (104b).

According to yet another embodiment, the source lines SL may all be combined into a single common source that is always at Vs. Noting the above mention of write disturbance, this embodiment is most applicable to the memory array 102b. In such an embodiment, the row address decoder 104b would not be required to control the common source. This further reduces the control logic requirements and reduces the space occupied by the memory array 100b.

Although the above description has focused on specific embodiments, other alternatives and their equivalents are considered to be within the scope of the following claims.

What is claimed is:

1. A flash electrically-erasable, programmable read-only memory (EEPROM), comprising:
    a plurality of groups of memory cells configured to store information;
    one or more group select lines coupled to selectively provide a group voltage;
    a plurality of first select transistors coupled between said one or more group select lines and said plurality of groups of memory cells;
    a plurality of second select transistors coupled between said plurality of first select transistors, said plurality of groups of memory cells, and a source connection, wherein each of said plurality of second select transistors is associated with a corresponding one of said plurality of groups of memory cell, and wherein one of said plurality of second select transistors has a first terminal coupled to said source connection and a second terminal coupled to a plurality of control gates associated with a plurality of memory cells of one group of said plurality of groups of memory cells;
    a plurality of first word lines configured to control said plurality of first select transistors; and
    a plurality of second word lines configured to control said plurality of second select transistors.

2. The flash EEPROM of claim 1, wherein each of said plurality of groups of memory cells comprises eight memory cells.

3. The flash EEPROM of claim 1, wherein a memory cell of said plurality of groups of memory cells comprises a floating gate and a control gate.

4. The flash EEPROM of claim 1, wherein said plurality of groups of memory cells are arranged in one or more columns, and one of said one or more columns is associated with one of said one or more group select lines.

5. The flash EEPROM of claim 1, further comprising:
    a column decoder and multiplexer circuit configured to control said one or more group select lines.

6. The flash EEPROM of claim 1, wherein one of said plurality of first select transistors has a first terminal coupled to one of said one or more group select lines and a second terminal coupled to a plurality of control gates associated with a plurality of memory cells of one group of said plurality of groups of memory cells.

7. The flash EEPROM of claim 1, wherein said plurality of groups of memory cells are arranged in one or more rows, and one of said one or more rows is associated with one of said plurality of first word lines and one of said plurality of second word lines.

8. The flash EEPROM of claim 1, further comprising:
    a row decoder circuit configured to selectively provide a first voltage to said plurality of first word lines and a second voltage to said plurality of second word lines.

9. The flash EEPROM of claim 8, wherein said row decoder circuit is further configured to provide a source voltage to said source connection.

10. The flash EEPROM of claim 8, wherein said row decoder circuit is further configured to control said plurality of first select transistors via said plurality of first word lines and to control said plurality of second select transistors via said plurality of second word lines.

11. The flash EEPROM of claim 1, wherein said source connection comprises a plurality of source lines, said plurality of groups of memory cells are arranged in a plurality of rows, and one of said plurality of source lines is associated with one of said plurality of rows.

12. The flash EEPROM of claim 1, wherein said source connection comprises a plurality of source lines, said plurality of groups of memory cells are arranged in a plurality of rows, and one of said plurality of source lines is associated with two of said plurality of rows.

* * * * *